United States Patent
Niedernostheide et al.

(10) Patent No.: US 8,035,195 B2
(45) Date of Patent: Oct. 11, 2011

(54) SEMICONDUCTOR ELEMENT

(75) Inventors: Franz Josef Niedernostheide, Muenster (DE); Manfred Pfaffenlehner, Munich (DE); Hans-Joachim Schulze, Taufkirchen (DE)

(73) Assignee: Infineon Technologies AG, Villach (AT)

( * ) Notice: Subject to any disclaimer, the term of this patent is extended or adjusted under 35 U.S.C. 154(b) by 575 days.

(21) Appl. No.: 12/126,751

(22) Filed: May 23, 2008

(65) Prior Publication Data

US 2008/0290466 A1    Nov. 27, 2008

(30) Foreign Application Priority Data

May 25, 2007   (DE) .................. 10 2007 024 461

(51) Int. Cl.
 *H01L 29/866*    (2006.01)
(52) U.S. Cl. .. 257/605; 257/603; 257/481; 257/E29.335
(58) Field of Classification Search .................. 257/607, 257/605, 603, 481, E29.335
See application file for complete search history.

(56) References Cited

U.S. PATENT DOCUMENTS

| 7,728,402 B2 * | 6/2010 | Zhang et al. ............... 257/471 |
| 2002/0182831 A1 * | 12/2002 | Tsuchiaki .................. 438/533 |
| 2005/0258455 A1 * | 11/2005 | Schulze et al. ............. 257/213 |

FOREIGN PATENT DOCUMENTS

| DE | 10 2004 005 084 A1 | 8/2005 |
| EP | 1 608 025 A2 | 12/2005 |
| WO | WO 98/52232 | 11/1998 |

\* cited by examiner

*Primary Examiner* — Ngan Ngo
*Assistant Examiner* — Benjamin Tzu-Hung Liu
(74) *Attorney, Agent, or Firm* — Slater & Matsil, L.L.P.

(57) ABSTRACT

A semiconductor element includes a semiconductor layer having a first doping density, a metallization, and a contact area located between the semiconductor layer and the metallization. The contact area includes at least one first semiconductor area that has a second doping density higher than the first doping density, and at least one second semiconductor area in the semiconductor layer. The second semiconductor area is in contact with the metallization and provides lower ohmic resistance to the metallization than a direct contact between the semiconductor layer and the metallization provides or would provide.

18 Claims, 6 Drawing Sheets

SEMICONDUCTOR ELEMENT

This application claims priority to German Patent Application No. 10 2007 024 461.6, which was filed on May 25, 2007, and is incorporated herein in its entirety by reference.

TECHNICAL FIELD

Embodiments of the present invention relates to a semiconductor element having improved operational features and in particular to improved surge current properties.

BACKGROUND

Power diodes as are used, for example, in motor vehicle electronics, or generally in circuits comprising bridge drivers, are optimized with regard to their varied device parameters. In this context, it is desirable to strike a balance between different criteria or diode parameters. On the one hand, diodes having very good switch-off properties wherein the current does not snap in the reverse direction, but comes to an end softly so as to avoid induced voltage peaks and oscillations, but also diodes comprising sufficient surge current-carrying capacity are in demand. In the event of a surge current, a current more than ten times the nominal current of the diode may flow. In addition, the power losses occurring during operation of the diode are kept to a minimum. Switching operations on the power diodes and the power losses associated therewith may give rise to temperatures which may lead to a degradation or destruction of the device and the associated circuits.

Frequently, possibilities of optimizing the above-mentioned diode parameters entail disadvantages with regard to other diode parameters. For example, a gentle switch-off behavior of a diode may be achieved by suitable doping measures within the diode, which, however, frequently entails reduced surge current-carrying capacity of the device.

Therefore, what would be desirable is a semiconductor element for a power diode which comprises a high surge current-carrying capacity without entailing major drawbacks with regard to other important diode parameters, such as the switch-off behavior, the power losses or the forward voltage.

SUMMARY OF THE INVENTION

In accordance with embodiments, the present invention provides a semiconductor element comprising a semiconductor layer having a first doping, a metallization, and a contact area between the semiconductor layer and the metallization. The contact area comprises at least one first semiconductor area in the semiconductor layer. The at least one first semiconductor area is in contact with the metallization and comprises a second doping density higher than the first doping density. At least one second semiconductor area is disposed in the semiconductor layer. The at least one second semiconductor area is in contact with the metallization and provides lower ohmic resistance to the metallization than a direct contact between the semiconductor layer and the metallization provides or would provide, and has a lower injection propensity than the first semiconductor area.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
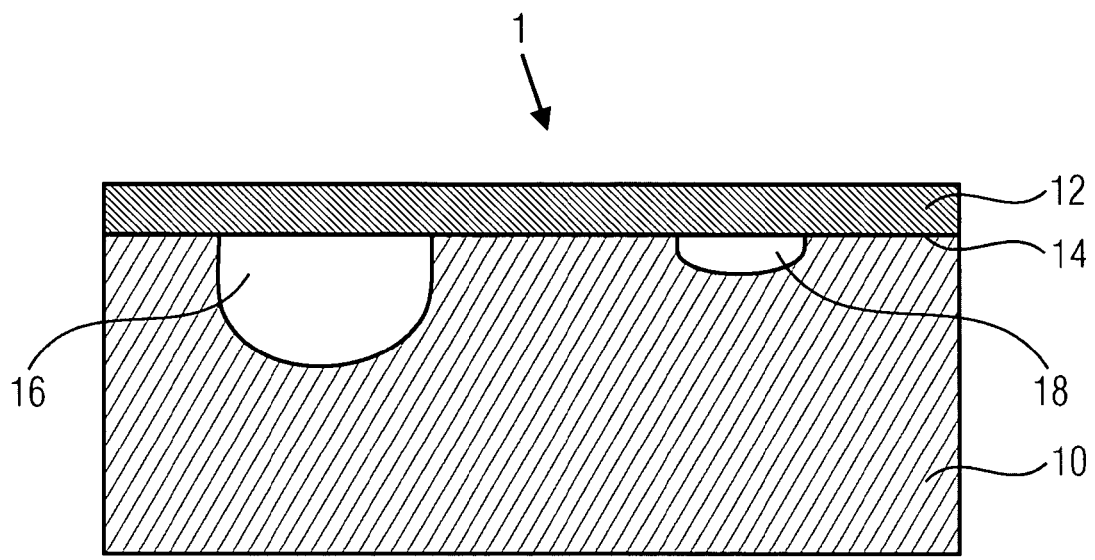
FIG. 1 shows the schematic cross-section of a semiconductor element in accordance with an embodiment of the present invention.

With reference to the FIGS. 1 to 11, embodiments of the semiconductor element comprising low ohmic contact resistance and controlled injection propensity, and with regard to the method of producing a semiconductor element having low contact resistance and a controlled injection propensity shall be set forth below in detail.

With regard to the description which follows of the embodiments of the present invention, it should be noted that for simplification purposes, throughout the description identical reference numerals shall be used in the various figures for elements which are functionally identical or have the same action or the same function or are equivalent, the descriptions being mutually applicable and interchangeable.

With reference to FIG. 1, the architecture of the semiconductor element in accordance with an embodiment of the present invention shall be explained in detail. A semiconductor element 1 comprises a semiconductor layer 10 having a first doping density, a metallization 12, and a contact area 14 between the semiconductor layer 10 and the metallization 12. The contact area 14 comprises at least one first semiconductor area 16 in the semiconductor layer 10, the at least one first semiconductor area 16 being in contact with the metallization 12 and comprising a second doping density higher than the first doping density, and at least one second semiconductor area 18 in the semiconductor layer 10, said at least one second semiconductor area 18 being in contact with the metallization 12 and providing lower ohmic resistance to the metallization 12 than a direct contact between the semiconductor layer 10 and the metallization 12 provides or would provide, and having a lower injection propensity than the first semiconductor area 16.

The semiconductor layer 10 of the semiconductor element 1 may comprise silicon, for example, but may also comprise other materials employed for realizing the semiconductor element and used in semiconductor technology, such as SiC, SiGe, GaAs, or InP. The semiconductor element 1 may be part of a semiconductor device, for example, the semiconductor element may be part of a diode, in particular of a power diode or of other power devices, such as an insulated gate bipolar transistor (IGBT) or a thyristor. The first doping density may be a p or an n doping, depending on the semiconductor element to be produced and on the semiconductor production technique to be employed. For the following embodiments, the n or p dopings indicated by way of example may be interchanged accordingly, and the exemplary embodiments thus do not represent any limitation with regard to the nature of the doping.

For example, the metallization 12 may be aluminum, but also other metallic compounds or silicide compounds as are employed in semiconductor technology for producing metal semiconductor contacts. The first and second semiconductor areas with their respective doping densities may be produced by means of common semiconductor doping methods, such as implantation and/or diffusion.

Figure 2:
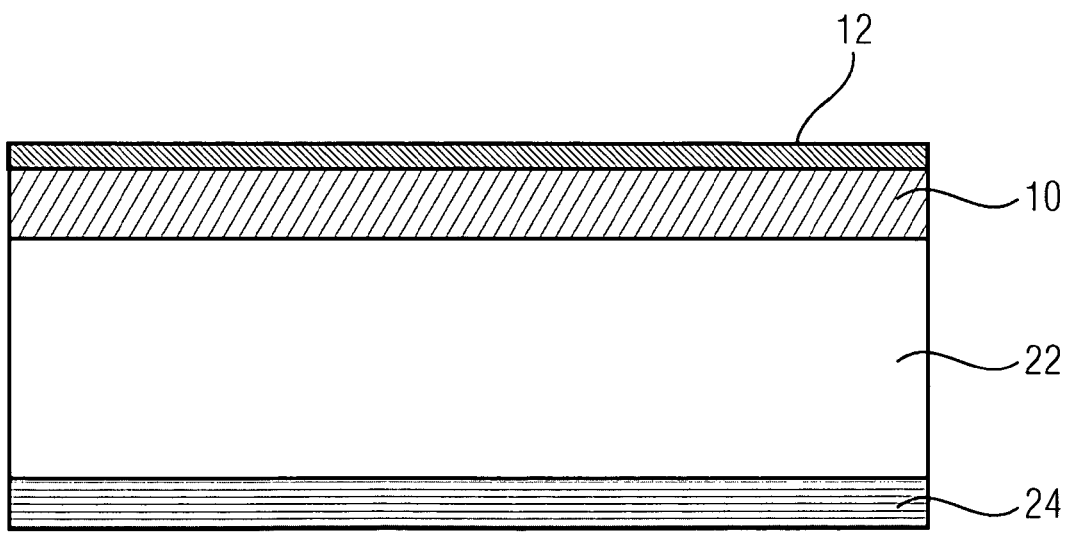
FIG. 2 shows the schematic cross-section of a diode.

The architecture of a power diode having a satisfactory switch-off behavior shall be depicted by way of example with reference to FIG. 2. The power diode exhibits a sufficiently gentle switch-off behavior, so that hardly any snapping in the flow of the reverse current occurs which may lead to undesired induced voltages or oscillations within the power diode or the respective circuit. This may be achieved by applying the so-called emitter-controlled principle (EMCON), wherein a relatively weak p emitter 10 is formed at a lightly doped, or intrinsic, n area 22 adjoined by a heavily doped $n^+$ layer 24. A metallization layer 12 may be deposited on the weak p emitter 10. A potential metallization on the rear of the heavily doped $n^+$ layer is not depicted in the embodiments which follow. What is disadvantageous about this arrangement is reduced surge current-carrying capacity, since in the event of a surge current, i.e., at a current typically about ten times the amount of nominal current, not enough charge carriers can be injected via the weak p emitter 10, which may lead to an increased voltage drop across the diode. This high voltage may cause an increase in the failure rate of such power diodes.

This may be improved, for example, in that the charge carrier distribution within the diode is influenced in a controlled manner, as is put into practice, for example, with the controlled axial lifetime diodes (CAL). With these diodes, a heavily doped p emitter may be employed, which indeed leads to an improved injection propensity, on the one hand, as may be useful, for example, in the event of surge current, but which may also lead to an increase in the switch-off losses, on the other hand, since due to the improved injection, the charge stored within the diode is increased. To avoid this, charge-carrier recombination centers may be created in the CAL diodes in the area of the p-n junction by means of helium or, e.g., proton irradiation. This may be employed to locally lower the charge-carrier lifetime in a targeted manner so as to reduce the switch-off power losses of the diode.

Figure 3:
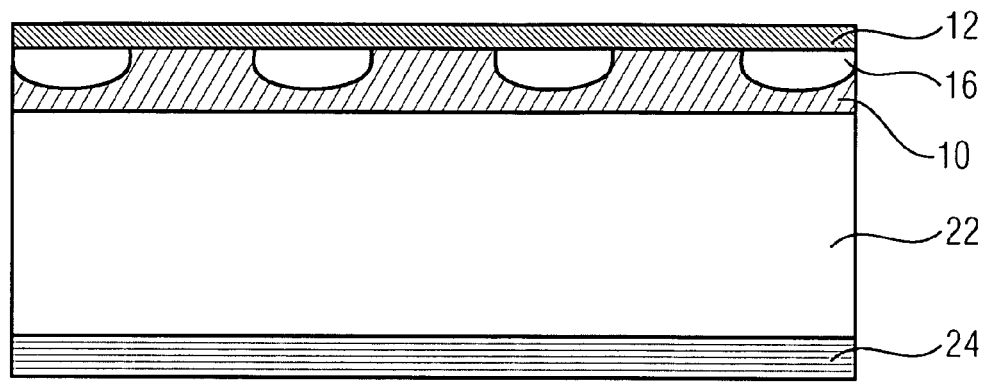
FIG. 3 shows the schematic cross-section of a diode comprising a first semiconductor area which has a second doping density.

FIG. 3 shows the schematized cross-section through a conventional diode comprising several first semiconductor areas 16 in the semiconductor layer 10 which are in contact with a metallization 12. The first semiconductor area 16 has a second doping density higher than a first doping density of the semiconductor layer 10. In the example, the semiconductor layer 10 is adjoined by a semiconductor layer 22, which may be lightly $n^-$ doped, for example, and by a further layer 24 which may be heavily $n^+$ doped, for example. The semiconductor layer 10 may be $p^-$ doped, for example, whereas the first semiconductor areas 16 may comprise high $p^+$ dopings. This diode variant is characterized by a high surge current-carrying capacity, since its first semiconductor areas 16 are heavily doped $p^+$ zones across which a large number of charge carriers may be injected in the event of a surge current. This diode variant is therefore also referred to as self-adjusting p emitter efficiency diode (SPEED). It is characterized by a structured, anode-side emitter which is essentially characterized in that the heavily doped $p^+$ zone 16 exists locally only. By suitably designing the doping profiles of the $p^+$ zones and of the $p^-$ zone as well as their geometrical dimensions, one may achieve that the forward current under common operating conditions essentially flows across the $p^-$ zone, whereas in the event of a surge current, a large portion of the current is injected across the heavily doped $p^+$ zones. Depending on the area ratio of the two anode areas, it is thus either the surge current-carrying capacity or the switch-off behavior that can be optimized. Because of different junction potentials between the $p^+$-$p^-$-n and the $p^-$-n junctions, the electrons advantageously flow to the metallization across the $p^-$ doped zone. With high current densities, this inhomogeneity in the electron density leads to a not insubstantial potential difference between the $p^+$ doped first semiconductor areas 16 and the $p^-$ zones of the semiconductor layer 10, which leads to increased injection of holes across the $p^+$ doped semiconductor areas 16. The SPEED diodes, however, may comprise relatively high power losses and be problematic also with regard to dynamic robustness.

In device simulations it can be shown that the concept of a SPEED diode is effective only if, on the one hand, the doping of the $p^+$ zones is sufficiently heavy, but, on the other hand, the doping of the less heavily doped $p^+$ zone is sufficiently low. What is problematic here is that the doping of the less heavily doped $p^-$ zone should be reduced to such an extent that the edge concentration of this zone is lower than $10^{16}$ atoms per cm$^3$. In turn, this entails that in connection with the metallization 12 deposited on the semiconductor surface, no ohmic contact with low contact resistance is formed for doping densities of this order of magnitude. Typically, a Schottky contact or, in the case of a slightly higher doping density, high-ohmic contact may form between the metallization and the lightly doped $p^-$ zone 10. This increased contact resistance may lead to an undesired increase in the forward voltage of the diode, which is why such a dimensioning of the diode is undesired.

Figure 4:
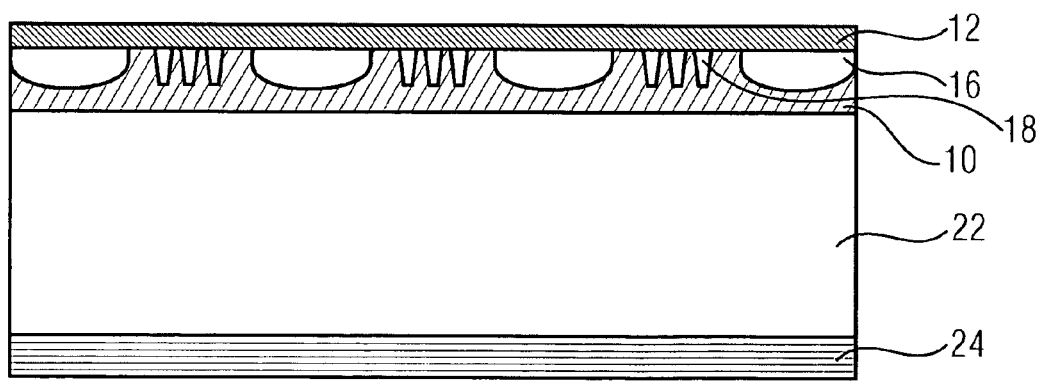
FIG. 4 shows the schematic cross-section of a diode comprising a first semiconductor area having a second doping density, and comprising very narrow second semiconductor areas having a third doping density.

FIG. 4 shows a schematized cross-section of the semiconductor element 1 comprising a semiconductor layer 10 having a first doping density, here a $p^-$ doping, for example, a metallization 12 and a contact area between the semiconductor layer 10 and the metallization 12, the contact area comprising several first semiconductor areas 16 in the semiconductor layer 10 which are in contact with the metallization 12, the first semiconductor areas 16 comprising a second doping density, here a $p^+$ doping, for example, which is higher than the doping density of the semiconductor layer 10. In addition, in this embodiment the semiconductor layer comprises several second semiconductor areas 18 in the semiconductor layer 10 which are in contact with the metallization 12. By introducing the second semiconductor areas 18 into the semiconductor layer 10, which are in contact with the metallization 12, good contacting of this area with the metallization may be achieved even for a relatively low doping of the semiconductor layer 10. Thus, a low-ohmic contact area with the metallization may form. So that a low-ohmic contact may form, the second semiconductor areas 18 may comprise a third p doping density which is higher than the low p⁻ doping density of the semiconductor layer 10, on the one hand, and is smaller than the second doping density of the first semiconductor area 16, with its high p⁺ doping, on the other hand. For example, the second semiconductor area 18 may comprise a doping dose of between $1 \times 10^{12}$ cm⁻² and $1 \times 10^{15}$ cm⁻² or between $5 \times 10^{12}$ cm⁻² and $1 \times 10^{14}$ cm⁻², and the first semiconductor area 16 may comprise a doping dose of between $5 \times 10^{13}$ cm⁻² and $5 \times 10^{16}$ cm⁻² or between $1 \times 10^{15}$ cm⁻² and $1 \times 10^{16}$ cm⁻², for example. On the one hand, the second semiconductor areas 18 should have a doping which leads to a good ohmic contact with the metallization 12, on the other hand they should have a relatively small lateral extension so that a relatively small number of charge carriers are injected across these additional contact areas in the forward operation of the diode. In contrast to the p⁺ doped first semiconductor areas 16, across which sufficient charge carriers may be injected in the event of surge current, the lateral extension of these second semiconductor areas should be as small as possible. This means that a relatively small number of charge carriers are to be injected across the second semiconductor areas 18 in the forward operation under typical operating conditions, since these charge carriers may cause increased power dissipation and reverse current snapping when the diode is switched off. The lower injection propensity of the second semiconductor areas 18, which serve as contact improvement areas, may be achieved in that they either have a smaller lateral dimension and/or are less heavily doped than the heavily doped first semiconductor areas 16 which in the event of a surge current act as injection areas. The injection propensity of more heavily doped areas in a lightly doped area is dominated by the lateral resistance of the lightly doped area, the so-called shunt resistance, which is why the contact improvement areas, the second semiconductor areas 18, should have as small lateral dimensions as possible. The lower limit of the dimension is determined by the lithography technique, by the mask technique, and by the lateral underdiffusion of the doping. Generation of these zones should be performed as close to the end of the manufacturing process of the semiconductor element as possible. The injection propensity may thus be controlled by means of the lateral extension of the second semiconductor areas 18. The distance of these second semiconductor areas 18 should be selected such that the lateral ohmic voltage drop in the intermediate, less heavily p⁻ doped zones is not too large. The distance and the width of the second semiconductor areas 18 typically amount to one to three times that of the charge carrier diffusion length. For example, the lateral extension of the second semiconductor areas 18 may range between 0.5 µm and 30 µm or between 3 µm and 10 µm for a 3 kV power diode. The distance between the second semiconductor areas 18 may range between 5 µm and 50 µm for a 3 kV power diode, for example. These dimensions may be easily implemented using common lithography techniques.

The maximum lateral extension of the second semiconductor area 18 should advantageously be smaller than the maximum lateral extension of the first semiconductor area 16. For example, the second semiconductor area 18 may have a maximum lateral extension smaller than 30 µm, smaller than 15 µm or even smaller than 10 µm. The first semiconductor area 16 may have a lateral extension of between 40 µm and 100 µm or even between 50 µm and 70 µm, for example.

The lower injection propensity of the additional contact improvement areas—the second semiconductor areas 18—thus may be achieved by their smaller lateral extension. In this context, the doping density of the contact improvement areas and of the injection areas—of the first semiconductor areas 16—may be the same. The smaller injection effect of the second semiconductor areas 18 may also be achieved, however, when they are less heavily doped than the first semiconductor areas 16. Such a difference in the doping densities of the first and second semiconductor areas, however, may be costly in terms of implementation, since an additional implantation step may be performed. If the mask dimension 30 for the second semiconductor areas 18 is sufficiently small, however, specifically between 5 and 50% of the extension of the lateral underdiffusion 32, for example, (see FIG. 11), the diffusion in the vertical and lateral directions inevitably results in a reduction in the doping concentration as compared to the zones 16, which are clearly more extensive in the lateral direction; i.e., in this case, a combination of the measures described is achieved without large-scale technological expenditure.

As is illustrated in FIG. 4, several second semiconductor areas 18 may be arranged between two first semiconductor areas 16. For example, if in a diode structure the first and second semiconductor areas have identical doping densities, and if in a radially symmetric structure, five narrow second semiconductor areas 18 comprising a diameter of 11 µm and a distance of 10 µm are arranged between two first semiconductor areas 16, this diode structure may comprise, at a nominal-current density of approx. 100 A/cm², a voltage drop comparable to a diode structure of FIG. 2—an EMCON diode—, whereas the diode voltage may be reduced by about 25% in the event of surge current. Both diode types approximately have the same blocking capability.

Figure 5:
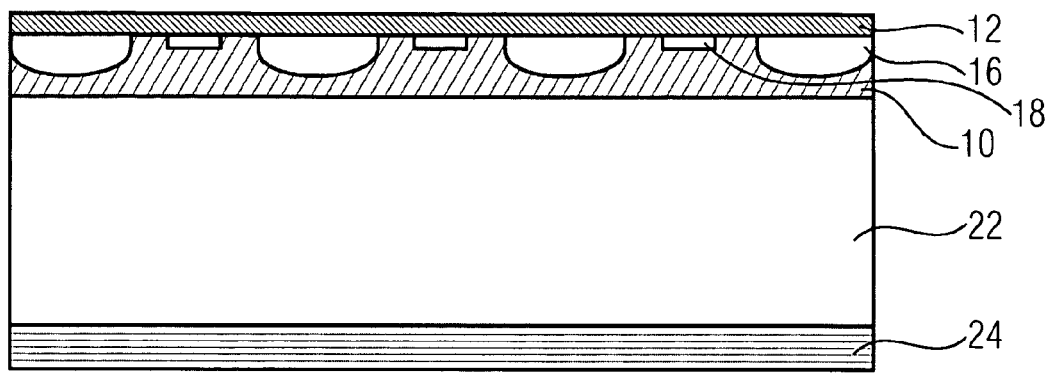
FIG. 5 shows a schematic cross-section of a diode comprising an acceptor zone implanted in a masked manner.
Figure 6:
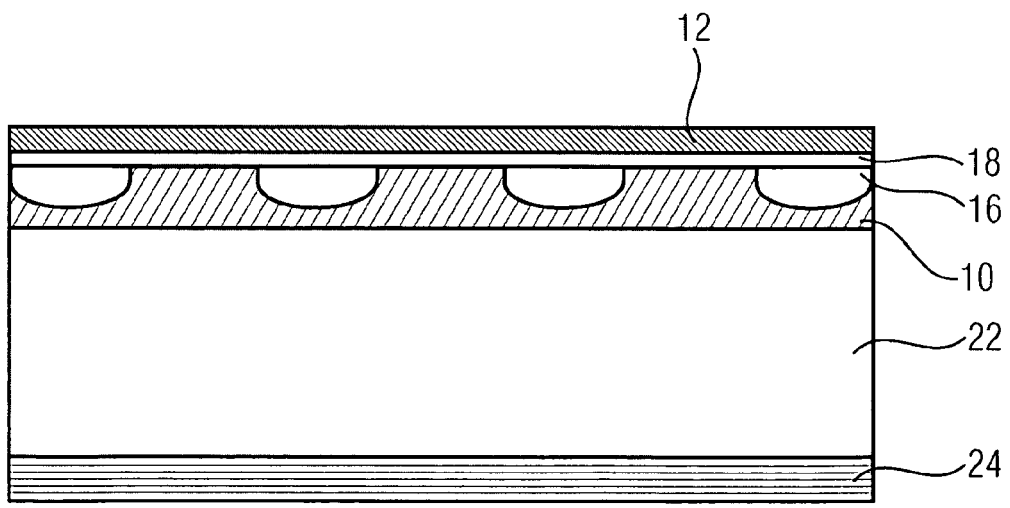
FIG. 6 shows a schematic cross-section of a diode comprising an acceptor zone which is implanted over the whole surface area.

Further embodiments of a semiconductor element in accordance with the present invention are represented in FIG. 5 and FIG. 6. To reduce the contact resistance between the lightly p⁻ doped zone 10 and metallization 12, a masked or even full-area implantation may be performed, for example, as close to the end of the manufacturing process of the semiconductor element as possible. Depending on the architecture of the semiconductor element, the implementation may be an acceptor implementation or a donator implementation. In the embodiments of FIGS. 5 and 6, acceptor implementation is employed, since the semiconductor layer 10 in this example comprises light p⁻ doping. This implementation may be subsequently annealed at relatively low temperatures. For example, the annealing temperature may range between 350° C. and 450° C., typical annealing times ranging from 15 minutes to 2 hours. In the embodiments in FIGS. 5 and 6, the contact improvement areas, the second semiconductor areas 18, may thus be formed by masked (FIG. 5) or even full-area implementation (FIG. 6), which is subsequently annealed at relatively low temperatures. Thereby, the implantation is not fully activated, and in addition, because of the resulting low penetration depth of this layer 18 which depending on the implantation energy typically ranges from 100 nm to 400 nm, the charge carrier recombination has effects at the interface between the semiconductor material and the metallization, which is why the injection propensity, or the emitter action, of these areas is smaller than the emitter action of the heavily doped first semiconductor areas 16. On the other hand, however, because of the implantation-induced defects, which lead to an additional energy level in the bandgap, an improved ohmic contact between the metallization 12 and the second semiconductor areas 18 may be achieved as compared to the contact between the metallization 12 and the semiconductor layer 10.

Figure 7:
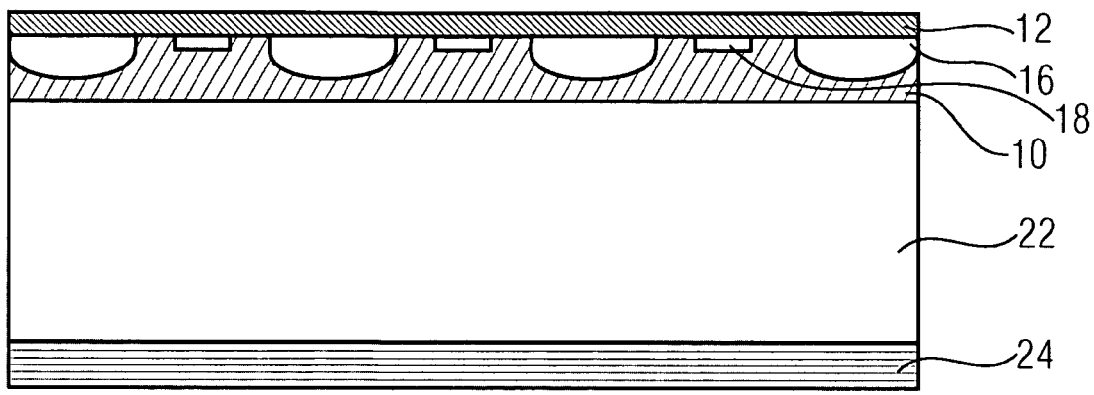
FIG. 7 shows a cross-section of a diode comprising an amorphized damage zone implanted in a masked manner.

A schematized cross-section, comparable to FIG. 5, of a diode in accordance with a further embodiment of the present invention is shown in FIG. 7. In this embodiment, the second semiconductor areas 18 may be formed by an amorphizing damage ion implantation in a masked manner, as is depicted in FIG. 7, or in a full-area manner, similar to the representation in FIG. 6. In the damage ion implantation, the second semiconductor areas 18 may be formed by means of an implantation with ions such as argon ions, which are electrically inactive. By means of the damage ion implantation, the crystalline structure of the semiconductor layer 10 may be amorphized in the respective places, which is why these areas will also be referred to as damage zones below. The ions which remain within the amorphized grid structure in the damage ion implantation are electrically inactive. The resulting amorphous damage zones, which represent the second semiconductor areas 18, enable, in the case of a subsequent metallization, increased penetration of the metallization atoms into these second semiconductor areas 18. As the metallization one may use aluminum, for example. In these second semiconductor areas 18, this results in a very low ohmic contact resistance, on the one hand, and in a low injection propensity, on the other hand, since with subsequent tempering at temperatures which may typically range from 350° C. to 500° C., not only a relatively high electrically active aluminum concentration, but also a high density of metallization spikes may form. These spikes lead to an increased recombination and also to a shortening of this zone, as it were, i.e., to local short circuits between the zone 10 and the metallization 12, so that the emitter efficiency of the zones 18 thus produced is reduced. Thus, a second semiconductor area 18 comprising an ohmic contact resistance smaller than the contact resistance between the metallization 12 and the semiconductor layer 10 may be formed by means of the damage ion implantation. In addition, these second semiconductor areas 18 have a lower injection propensity than the first semiconductor areas 16.

Figure 8A:
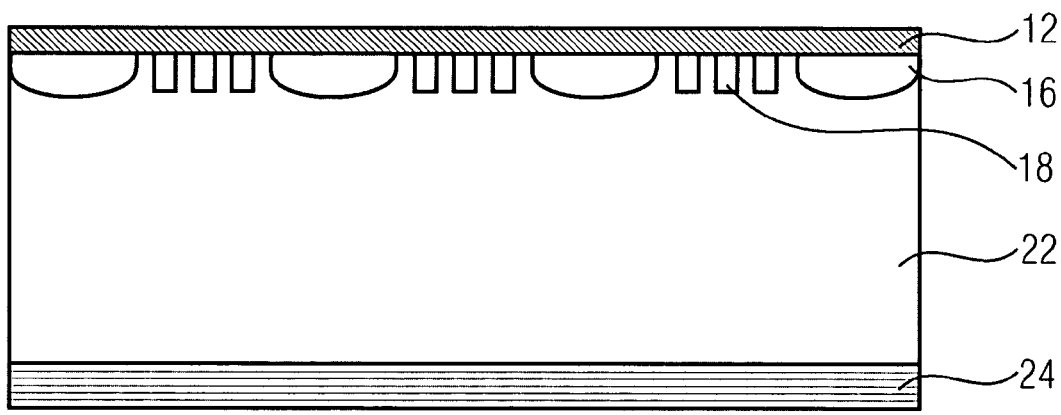
FIG. 8a shows a cross-section of a diode comprising no lightly doped p⁻ zone.
Figure 8B:
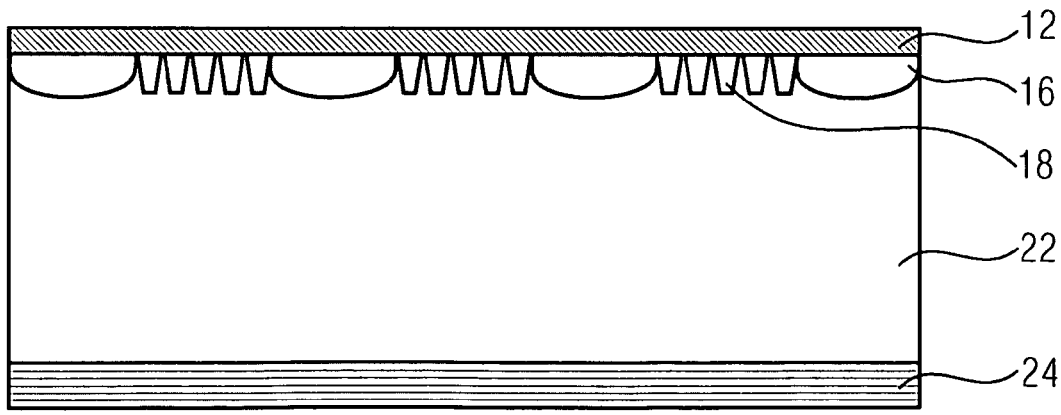
FIG. 8b shows a cross-section of a diode without any lightly doped p⁻ zone, the diode comprising overlapping second semiconductor areas.

In the embodiment of FIG. 8a, a schematized cross-section of a diode is depicted wherein with suitable dimensioning of the first and second semiconductor areas, the semiconductor layer 10, which, for example, is lightly p⁻ doped, may be dispensed with, so that a direct contact area may form between the metallization 12 and, in this case, for example, the lightly n⁻ doped layer 22. So that a functioning diode may be formed also with this arrangement, the first and second semiconductor areas should be so closely adjacent to one another that spreading of the electric field of the diode to the metallic contact 12 is prevented. The heavily p⁺ doped first semiconductor areas 16 may comprise a diameter of about 60 µm, for example, and the distance between adjacent second semiconductor areas and between adjacent first and second semiconductor areas may range from 12 µm to 20 µm, the adjacent semiconductor areas not overlapping even after the diffusion. It is also feasible for the distance between adjacent second semiconductor areas and between adjacent first and second semiconductor areas to range from 0 µm to 12 µm, and for the adjacent semiconductor areas to overlap after a diffusion (see FIG. 8b). As is indicated in FIG. 8b, this overlap should be formed only at the surface of the semiconductor layer, whereas further down, there should be a distance between the semiconductor areas.

Figure 9:
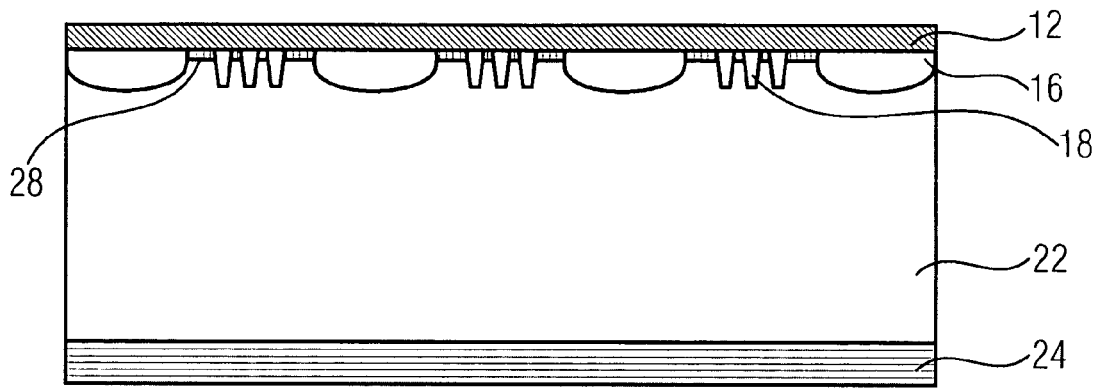
FIG. 9 shows a cross-section of a diode comprising an insulating layer.

FIG. 9 shows a further embodiment of the present invention, this schematized cross-section also omitting the semiconductor layer 10 and having an insulating layer 28 arranged between the metallization 12 and the lightly n doped layer 22 between the first semiconductor areas 16 and between the second semiconductor areas 18. The insulating layer may be an $SiO_2$ layer, for example. The semiconductor layer 22 may comprise one or several second semiconductor areas 18. The insulating layer 28 may thus prevent direct electrical contact between the metallization 12 and the semiconductor layer 22.

In an embodiment of the invention a semiconductor element may comprise a semiconductor layer, which is doped with a first doping density. Furthermore the semiconductor element may comprise a metallization and a contact area between the semiconductor layer and the metallization. The contact area may include at least one first semiconductor area in the semiconductor layer. This at least one first semiconductor area can be in contact with the metallization and may comprise a second doping density, which is higher than the first doping density. Furthermore this contact area may include at least one second semiconductor area in the semiconductor layer, wherein the at least one second semiconductor area is in contact with the metallization and comprises a lower ohmic resistance to the metallization than a direct contact between the semiconductor layer and the metallization provides or would provide. In addition it may comprise a lower injection propensity than the first semiconductor area.

In addition in another embodiment of the invention, several second semiconductor areas are arranged between two first areas. In addition to the foregoing embodiment in a further embodiment the distance between adjacent second semiconductor areas may be range from 3 µm to 40 µm, or from 5 µm to 30 µm.

According to another embodiment the semiconductor element may, in addition, comprise several second semiconductor areas. The semiconductor layer may comprise a first doping type and the first and the second semiconductor areas comprise a second type. In this embodiment the maximum distance between adjacent second semiconductor areas and between adjacent first and second semiconductor areas may range between 0 µm to 12 µm.

According to another embodiment of the invention an integrated circuit may comprise a semiconductor element. This semiconductor element has a semiconductor layer with a first doping density and a metallization. Furthermore a contact area may be disposed between the semiconductor layer and the metallization. This contact area may include at least one first semiconductor area in the semiconductor layer, wherein the at least one first semiconductor area is in contact with the metallization. The contact area further includes a second doping density higher than the first doping density and at least one second semiconductor area in the semiconductor layer. This at least one second semiconductor area may be as well in contact with the metallization and may comprise a lower ohmic resistance to the metallization than a direct contact between the semiconductor layer and the metallization provides or would provide. In addition this at least one second semiconductor area may reveal a lower injection propensity than the first semiconductor area.

In accordance to another embodiment of the invention a semiconductor diode structure comprises a first semiconductor layer of a first doping type, a second semiconductor layer comprising a first doping density of a second doping type. Furthermore the semiconductor structure exhibits bordering on the first semiconductor layer a metallization and a contact area between the second semiconductor layer and the metallization. The contact area comprises in this embodiment at least one first semiconductor area in the second semiconductor layer. The at least one first semiconductor area is in contact with the metallization and comprises a second doping density of the second doping type which is higher than the first doping density. Furthermore the contact area has at least one second semiconductor area in the second semiconductor layer, wherein the at least one second semiconductor area is in contact with the metallization and comprises lower ohmic resistance to the metallization than a direct contact between the second semiconductor layer and the metallization provides or would provide. In addition the at least one second semiconductor area may comprise a lower injection propensity than the first semiconductor area.

In a further embodiment of the invention the semiconductor diode structure may comprise a second semiconductor area with a third doping density, wherein the third doping density is higher than the first doping density and lower than the second doping density.

In addition the maximum lateral extension of the second semiconductor area can be smaller than the maximum lateral extension of the first semiconductor area. It is also possible that atoms from a metallization are arranged in the second semiconductor area.

An integrated circuit may also comprise a semiconductor diode structure with a first semiconductor layer of a first doping type and a second semiconductor layer, which comprises a first doping density of a second doping type.

Bordering on the first semiconductor layer the semiconductor diode structure may comprise a metallization and a contact area between the second semiconductor layer and the metallization. This contact area may comprise at least one first semiconductor area in the second semiconductor layer. The at least one first semiconductor area may be in contact with the metallization and may comprise a second doping density of the second doping type, which is higher than the first doping density. The contact area may further comprise at least one second semiconductor area in the second semiconductor layer. The at least one second semiconductor area is in contact with the metallization and comprises a lower ohmic resistance to the metallization than a direct contact between the second semiconductor layer and the metallization provides or would provide. The at least one second semiconductor area may have a lower injection propensity than the first semiconductor area.

An integrated circuit may comprise, according to another embodiment, a semiconductor diode structure. The semiconductor diode structure may have a semiconductor layer, which comprises a first doping density of a first doping type, a metallization and a contact area between the semiconductor layer and the metallization. The contact area may have a first semiconductor area in the semiconductor layer, wherein the first semiconductor area is in contact with the metallization and comprises a second doping density of a second doping type. Furthermore the contact area may comprise several second semiconductor areas in the semiconductor substrate which are in contact with the metallization. These second semiconductor areas provide lower ohmic resistance to the metallization than a direct contact between the semiconductor substrate and the metallization provides or would provide. The second semiconductor areas have a lower injection propensity than the first semiconductor area, wherein the maximum distance between adjacent second semiconductor areas and between adjacent first and second semiconductor areas ranges from 10 μm to 30 μm or advantageously from 15 to 25 μm, wherein the adjacent semiconductor areas do not overlap.

In another embodiment a semiconductor diode structure may have a semiconductor layer with a first doping density of a first doping type, a metallization and a contact area between the semiconductor layer and the metallization. This contact area can have a first semiconductor area in the semiconductor layer, wherein the first semiconductor area is in contact with the metallization and comprises a second doping density of a second doping type. The contact area may further include several second semiconductor areas in the semiconductor substrate which are in contact with the metallization and which provide lower ohmic resistance to the metallization than a direct contact between the semiconductor substrate and the metallization provides or would provide. Furthermore the several second semiconductor areas provide a lower injection propensity than the first semiconductor area. The maximum distance between adjacent second semiconductor areas and between adjacent first and second semiconductor areas may, in this embodiment, range from 0 μm to 12 μm. The adjacent semiconductor areas do not overlap following a diffusion.

According to a further embodiment an integrated circuit may comprise a semiconductor diode structure. This semiconductor diode structure has a semiconductor layer with a first doping density of a first doping type, a metallization and a contact area between the semiconductor layer and the metallization. The contact area may comprise a first semiconductor area in the semiconductor layer, wherein the first semiconductor area is in contact with the metallization and comprises a second doping density of a second doping type. Furthermore the contact area may have several second semiconductor areas in the semiconductor layer which are in contact with the metallization and which provide lower ohmic resistance to the metallization than a direct contact between the semiconductor substrate and the metallization provides or would provide. The several second semiconductor areas have a lower injection propensity than the first semiconductor area and the maximum distance between adjacent second semiconductor areas and between adjacent first and second semiconductor areas ranges, in this embodiment, from 0 μm to 12 μm. The adjacent semiconductor areas do not overlap following a diffusion.

Figure 10:
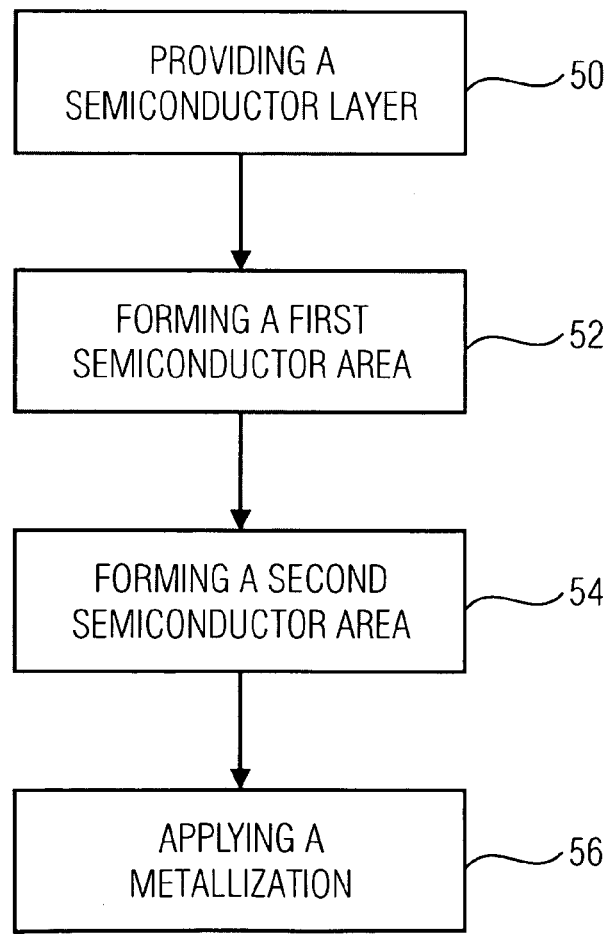
FIG. 10 shows a schematized flow chart for the method of producing a semiconductor element having low contact resistance and a controlled injection propensity.
Figure 11:
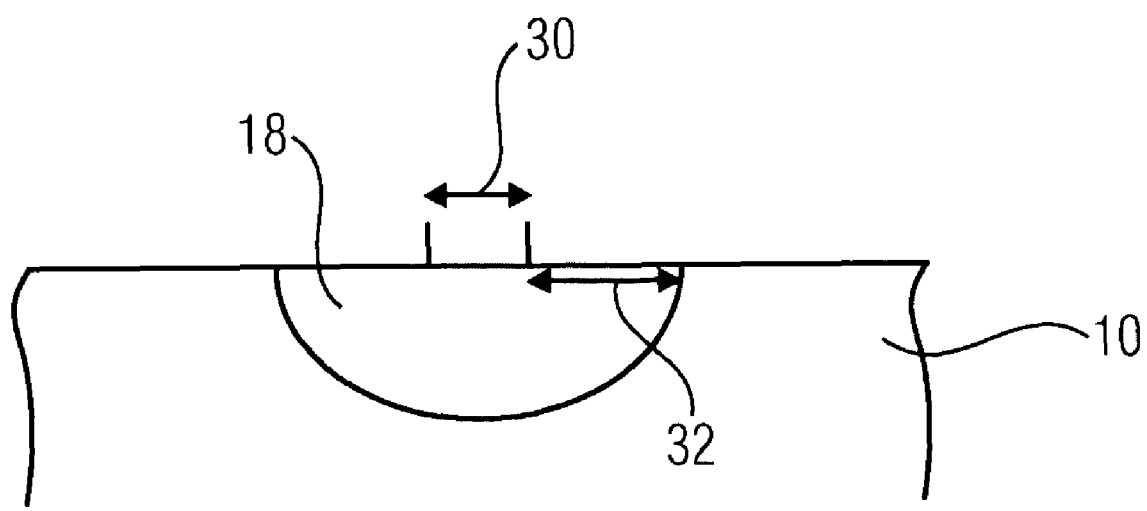
FIG. 11 shows a schematic cross-section for representing the underdiffusion for a doping having a small mask dimension.

FIG. 10 shows a flow chart on the method of producing a semiconductor element having low contact resistance and a controlled injection propensity. The method comprises providing (block 50) a semiconductor layer having a first doping density, and forming a contact area with the semiconductor layer. Forming a contact area comprises forming at least one first semiconductor area (block 52) in the semiconductor layer, the first semiconductor area having a second doping density higher than the first doping density. In addition, it comprises forming at least one second semiconductor area (block 54) in the semiconductor layer, said semiconductor area (block 54) providing lower ohmic resistance to a metallization than a direct contact between the semiconductor layer and a metallization provides or would provide, and having a lower injection propensity than the first semiconductor area. In addition, the method comprises applying (block 56) a metallization prior to or after forming the second semiconductor area, so that the first and second semiconductor areas are in contact with the metallization.

Formation of the second semiconductor area (block 54) may be performed such that the second semiconductor area has a third doping density higher than the first doping density and lower than the second doping density. The doping densities may be p or n doping densities, depending on the configuration of the semiconductor element to be produced. Formation of the first semiconductor area (block 52) and of the second semiconductor area (block 54) may be performed such that the maximum lateral extension of the second semiconductor area is smaller than the maximum lateral extension of the first semiconductor area. For example, formation of the second semiconductor area (block 54) may be performed such that the second semiconductor area comprises a maximum lateral extension smaller than 30 μm, smaller than 15 μm or smaller than 10 μm. Formation of the first semiconductor areas (block 52) may be performed, for example, such that the first semiconductor areas comprise a lateral extension of between 50 μm and 100 μm or between 50 μm and 70 μm. Formation of at least one first semiconductor area (block 52) and formation of at least one second semiconductor area (block 54) may be performed in an implantation step, i.e., formation of at least one first semiconductor area (block 52) and formation of at least one second semiconductor area (block 54) may be performed such that both semiconductor areas have the same doping density. Formation of the first and second semiconductor areas may be performed by means of common methods of semiconductor technology for forming a doping in a semiconductor layer. Formation of a second semiconductor area (block 54) may be performed such that the semiconductor layer comprises several second semiconductor areas between two first semiconductor areas. The second semiconductor area may also be formed by masked or full-area amorphizing damage ion implantation of the semiconductor layer and by means of tempering after the metallization. A further possibility of forming at least one second semiconductor area (block 54) consists in the masked or full-area acceptor or donator implantation of the semiconductor layer and subsequent tempering at a temperature which may range from 250° C. to 600° C., for example.

According to another embodiment of the method of producing a semiconductor element the method is performed by providing a semiconductor layer with a first doping density. Furthermore the method exhibits forming a contact area in the semiconductor layer by forming at least one first semiconductor area in the semiconductor layer. This first semiconductor area may have a second doping density, which is higher than the first doping density. In addition the method comprises forming at least one second semiconductor area in the semiconductor layer. The semiconductor area may provide a lower ohmic resistance to a metallization than a direct contact between the semiconductor layer and a metallization provides or would provide. Furthermore the second semiconductor area provides a lower injection propensity than the first semiconductor area. The method further comprises a metallization prior to or following the formation of the second semiconductor area, so that the first and second semiconductor areas are in contact with the metallization.

According to another embodiment the forming of the second semiconductor area is performed such that the second semiconductor area comprises a third doping density higher than the first doping density and lower than the second doping density.

It is also possible to form the first and second semiconductor areas such that the maximum lateral extension of the second semiconductor area is smaller than the maximum lateral extension of the first semiconductor area.

In addition in another embodiment the forming of the second semiconductor area is performed such that the second semiconductor area comprises a maximum lateral extension smaller than 30 µm, smaller than 15 µm, or advantageously smaller than 10 µm. In embodiments of the invention the forming the first and second semiconductor areas in the semiconductor layer is performed during implantation. For example during an ion-implantation.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A semiconductor element comprising:
   a semiconductor layer comprising a first doping density;
   a metallization; and
   a contact area between the semiconductor layer and the metallization, the contact area comprising:
      a first semiconductor area in the semiconductor layer, the first semiconductor area being in contact with the metallization and comprising a second doping density higher than the first doping density; and
      a second semiconductor area in the semiconductor layer, the second semiconductor area being in contact with the metallization and comprising lower ohmic resistance to the metallization than a direct contact between the semiconductor layer and the metallization provides or would provide, the second semiconductor area comprising a lower injection propensity than the first semiconductor area, wherein the semiconductor layer and the first and second semiconductor areas comprise the same doping type.

2. The semiconductor element as claimed in claim 1, wherein the second semiconductor area comprises a third doping density higher than the first doping density and lower than the second doping density.

3. The semiconductor element as claimed in claim 2, wherein the second semiconductor area is provided over the entire area in places where the first semiconductor area is not provided.

4. The semiconductor element as claimed in claim 1, wherein a maximum lateral extension of the second semiconductor area is smaller than a maximum lateral extension of the first semiconductor area.

5. The semiconductor element as claimed in claim 4, wherein the first and second semiconductor areas comprise identical doping densities at the contact area.

6. The semiconductor element as claimed in claim 1, wherein the second semiconductor area comprises a maximum lateral extension smaller than 30 µm.

7. The semiconductor element as claimed in claim 1, wherein the first semiconductor area comprises a lateral extension of between 40 µm and 100 µm.

8. The semiconductor element as claimed in claim 1, wherein the second semiconductor area comprises a doping dose of between $1\times10^{12}$ cm$^{-2}$ and $1\times10^{15}$ cm$^{-2}$.

9. The semiconductor element as claimed in claim 1, wherein the second semiconductor area comprises a lower doping density than the first semiconductor area, and a doping gradient formed by means of underdiffusion of a mask.

10. The semiconductor element as claimed in claim 1, wherein the first semiconductor area comprises a doping dose of between $5\times10^{13}$ cm$^{-2}$ and $5\times10^{16}$ cm$^{-2}$.

11. The semiconductor element as claimed in claim 1, further comprising an insulating layer between the metallization and the semiconductor layer, the insulating region being arranged between the first and second semiconductor areas and between the second semiconductor areas.

12. The semiconductor element as claimed in claim 1, wherein atoms from the metallization are arranged in the second semiconductor area.

13. The semiconductor element as claimed in claim 12, wherein the second semiconductor area is an implanted amorphized damage zone.

14. A semiconductor diode structure comprising a semiconductor element according to claim 1, wherein the semiconductor layer comprises a first doping type, the semiconductor diode structure further comprising a second semiconductor layer which comprises a first doping density of a second doping type, wherein the second semiconductor layer borders on the semiconductor layer.

15. A semiconductor diode structure comprising:
a semiconductor layer comprising a first doping density of a first doping type;
a metallization; and
a contact area between the semiconductor layer and the metallization, the contact area comprising:
  a first semiconductor area in the semiconductor layer, said first semiconductor area being in contact with the metallization and comprising a second doping density of a second doping type; and
  a plurality of second semiconductor areas in the semiconductor layer that are in contact with the metallization and that provide lower ohmic resistance to the metallization than a direct contact between the semiconductor layer and the metallization provides or would provide, the second semiconductor areas comprising a lower injection propensity than the first semiconductor area, wherein a maximum distance between adjacent second semiconductor areas and between adjacent first and second semiconductor areas ranges from 10 µm to 30 µm, and the adjacent semiconductor areas do not overlap.

16. The semiconductor diode structure as claimed in claim 15, further comprising an insulating layer between the metallization and the semiconductor layer, the insulating layer being arranged between the first and second semiconductor areas and between the second semiconductor areas.

17. The semiconductor diode structure as claimed in claim 15, wherein a maximum lateral extension of the second semiconductor area is smaller than a maximum lateral extension of the first semiconductor area.

18. The semiconductor diode structure as claimed in claim 15, wherein the second semiconductor area comprises a lower doping density than the first semiconductor area.

* * * * *